US009081057B2

(12) United States Patent
Kim et al.

(10) Patent No.: US 9,081,057 B2
(45) Date of Patent: Jul. 14, 2015

(54) PROBE CARD HANDLING CARRIAGE (71) Applicant: SAMSUNG ELECTRONICS CO., LTD., Suwon-si, Gyeonggi-do (KR)

(72) Inventors: Kwang Jun Kim, Ansan-si (KR); Tae Jun Sang, Suwon-si (KR); Hyun Sik Sim, Yongin-si (KR); Ki Hoon Nam, Suwon-si (KR); Yong Won Choi, Yongij-si (KR); Jong Hwi Seo, Gyeonggi-do (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 286 days.

(21) Appl. No.: 13/655,072

(22) Filed: Oct. 18, 2012

(65) Prior Publication Data

US 2013/0099815 A1   Apr. 25, 2013

(30) Foreign Application Priority Data

Oct. 24, 2011   (KR) ........................ 10-2011-0108572

(51) Int. Cl.
  *G01R 31/00* (2006.01)
  *G01R 31/28* (2006.01)
(52) U.S. Cl.
  CPC ........ *G01R 31/2893* (2013.01); *G01R 31/2867* (2013.01)

(58) Field of Classification Search
  None
  See application file for complete search history.

(56) References Cited

U.S. PATENT DOCUMENTS

| 5,143,450 A | 9/1992 | Smith et al. | |
| 2003/0178987 A1* | 9/2003 | Suzuki | 324/158.1 |

FOREIGN PATENT DOCUMENTS

| JP | 2007-165715 | 6/2007 |
| KR | 10-0833285 | 5/2008 |
| KR | 10-2010-0016998 | 2/2012 |
| WO | WO 2008/078886 | 7/2008 |

OTHER PUBLICATIONS

English translation of JP2007-165715 Jun. 28, 2007.*
English Description translation of KR 1020100016998 [KR101019535].*
English translation of KR 1020100016998 [Abstract, Explanation of drawing, Claims and Drawing].*
Partial European Search Report dated Mar. 19, 2015 from European Patent Application No. 12189527.0, 6 pages.

* cited by examiner

*Primary Examiner* — Jermele M Hollington
(74) *Attorney, Agent, or Firm* — Staas & Halsey LLP (57) ABSTRACT A probe card handling carriage is applicable to various working environments. The probe card handling carriage includes a main body provided to be travelable on the ground, a drawer unit provided to be movable in a forward and backward direction with respect to the main body, and a transfer robot installed on the drawer unit to transfer a probe card.

20 Claims, 12 Drawing Sheets

PROBE CARD HANDLING CARRIAGE

CROSS-REFERENCE TO RELATED APPLICATIONS

This application claims the priority benefit of Korean Patent Application No. 10-2011-0108572, filed on Oct. 24, 2011 in the Korean Intellectual Property Office, the disclosure of which is incorporated herein by reference.

BACKGROUND

1. Field

Embodiments disclosed herein relate to a heavy load handling carriage which enables transfer of a heavy load, such as a probe card, under various working environments.

2. Description of the Related Art

In general, a semiconductor fabrication process passes through various process equipment which process a wafer according to various methods. After the fabrication process of the wafer has been completed, a test process to identify defective chips from among the semiconductor chips formed on the wafer is carried out before packaging of the semiconductor chips. Since such a test process is carried out in a tester, the wafer to be tested must be loaded into or unloaded from the tester. Therefore, to perform the test process the wafer is accommodated in an exclusive test jig, i.e., a probe card.

Since such a probe card generally has a weight of 20 kg or more, if a worker manually transfers the probe card from a stocker in which probe cards are stored to the tester, the worker is burdened and thus an exclusive or specialized carriage may be used.

However, various types of equipment may be densely disposed on a semiconductor fabrication line, and thus a moving space may be limited and narrow or a duct forming a stepped structure may be formed in the moving space according to the circumstances and layout of the semiconductor fabrication line.

Therefore, there is an increasing need for development of a carriage capable of transferring a heavy load, such as a probe card, in a semiconductor fabrication line which has a complicated structure.

SUMMARY

Therefore, it is an aspect of the present invention to provide a probe card handling carriage which is applicable to various working environments.

It is another aspect of the present invention to provide a probe card handling carriage which is applicable to transfer of probe cards of various standards.

Additional aspects of the invention will be set forth in part in the description which follows and, in part, will be obvious from the description, or may be learned by practice of the invention.

In accordance with one aspect of the present invention, a probe card handling carriage includes a main body provided to be travelable on the ground, a drawer unit provided to be movable forward and backward with respect to the main body, and a transfer robot installed on the drawer unit to transfer a probe card. The drawer unit may be in a substantially L-shaped form, and include a horizontal part and a vertical part.

The probe card handling carriage may further include a support device installed on the drawer unit and provided to be supportable by the ground to prevent the main body from falling over.

The support device may be connected to the drawer unit so as to be movable upward and downward.

The support device may be moved downward according to extension of the drawer unit out of the main body.

The probe card handling carriage may further include a reverse prevention device enabling downward movement of the support device and maintaining the braking state of upward movement of the support device.

The reverse prevention device may release the braking state of upward movement of the support device by retraction of the drawer unit into the main body.

The reverse prevention device may include a rack arranged in the vertical direction on the drawer unit, a pinion installed on the support device, engaged with the rack and rotated according to upward and downward movement of the support device, a ratchet operated in connection with the pinion, and a pawl to restrict rotation of the ratchet such that the ratchet is rotated only in one direction.

The probe card handling carriage may further include a drawer drive motor to drive forward and backward movement of the drawer unit, and a carrier disposed in the vertical part of the drawer unit, moved by the drawer drive motor to guide upward and downward movement of the support device.

The carrier may contact the pawl and rotate the pawl to release restriction of rotation of the ratchet by the pawl, in order to guide upward and downward movement of the support device.

The probe card handling carriage may further include a drive pulley driven by the drawer drive motor to drive the carrier and a belt operated in connection with the drive pulley and connected to the carrier at one point.

A fall prevention unit extendible in the horizontal direction to support the support device against the ground may be installed on the support device. The support device may further include a rod unit extendable in the vertical direction and a support wheel disposed on a bottom portion of the support device to contact the ground.

The transfer robot may include a vertical transfer unit to move the transfer robot in a vertical direction and may be rotatable about a vertical axis of the vertical transfer unit. The transfer robot may further include a telescopic arm being expandable and contractible in the horizontal direction.

The transfer robot may include a holding unit installed at one end of the telescopic arm to hold the probe card and a vertical transfer unit to move the telescopic arm upward and downward.

At least one distance sensor to measure a distance to an obstacle may be installed on the main body.

At least one bumper sensor to sense contact with an obstacle may be installed on the main body.

The main body may be provided with a plurality of drive wheels driven by a transaxle motor to transport the probe card handling carriage.

The transfer robot may include a holding unit to hold probe cards of various standards, i.e., various shapes and dimensions. The holding unit may include a weight sensing unit to sense a weight of the probe card via one or more wires connected between a frame of the holding unit and the weight sensing unit.

The holding unit may include a plurality of guide pins contacting the probe card when the probe card is held by the holding unit, and each of the plurality of guide pins may include an insertion part connected to each of holes provided on the probe card to support the probe card.

The plurality of guide pins may include at least one first guide pin and at least one second guide pin, and the at least one second guide pin may be disposed at an outer region in the circumferential direction of the probe card than the at least one first guide pin.

The insertion part of the at least one guide pin may be movable forward and backward in the lengthwise direction of the at least one guide pin and is elastically supported by an elastic member.

The at least one second guide pin may include a flange part formed above the insertion part and extending in the circumferential direction of the at least one second guide pin.

The probe card handling carriage may accommodate a probe card having a first dimension, where the insertion part of the at least one first guide pin may be inserted into a first hole of the probe card and the flange part of the at least one second guide pin supports the probe card.

Additionally, the probe card handling carriage may accommodate a probe card having a second dimension, where the insertion part of the at least second first guide pin may be inserted into a second hole of the probe card and the insertion part of the at least one first guide pin is not inserted into a hole of the probe card.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Reference will now be made in detail to the embodiments of the present invention, examples of which are illustrated in the accompanying drawings, wherein like reference numerals refer to like elements throughout.

As shown in FIGS. 1 to 4, a probe card handling carriage 1 in accordance with one embodiment of the present invention includes a main body 10 provided to be travelable, a drawer unit 20 provided on the main body 10 to be movable forward and backward, and a transfer robot 30 installed on the drawer unit 20 to transfer a probe card P.

A cassette unit 11 in which probe cards P may be loaded is installed on the main body 10, and is provided with slots 11a configured in a 3-step structure so that the probe cards P may be seated therein. The respective slots 11a are separated in the vertical direction to form accommodation spaces for the probe cards P, and the cassette unit 11 is provided to be extendible toward a worker such that the worker hangs a probe card P loaded in the slot 11a on a holding unit 100 of the transfer unit 30, which will be described later.

A pair of drive wheels 12 for traveling and a pair of casters 13 freely changing direction are installed on the lower portion of the main body 10, and the drive wheels 12 are driven by a transaxle motor 14. Therefore, the respective drive wheels 12 may be independently rotated in regular and reverse directions by differential operation of the transaxle motor 14, thereby enabling a worker to rotate the carriage 1 at the minimum rotating radius in a narrow space. Further, even if the carriage 1 travels along a curved path, natural curved traveling of the carriage 1 may be executed by differently adjusting speed ratios of both drive wheels 12, thereby improving convenience for the worker.

Further, a bumper sensor 15 to sense contact with an obstacle may be installed on the main body 10, and may be set such that, when the bumper sensor 15 senses contact with an obstacle during traveling of the carriage 1 by a worker, a controller (not shown) announces a warning to the worker and emergency brakes traveling of the carriage 1. Further, a distance sensing unit 16 to measure a distance to an object through a non-contact method may be installed on the main body 10 separately from the bumper sensor 15. Such a distance sensing unit 16 may include an ultrasonic sensor and may be set such that, when the distance sensing unit 16 senses approach of an obstacle, the controller (not shown) announces a warning to the worker and emergency brakes traveling of the carriage 1 to prevent collision with the obstacle in the same manner as the bumper sensor 15.

The drawer unit 20 is slidably installed on the main body 10 so as to move forward and backward with respect to the main body 10 and thus to be extended out of and retracted into the main body 10. The drawer unit 20 may move forward and backward with respect to the main body 10 in the horizontal direction parallel with the ground. The drawer unit 20 may be formed in a substantially L-shaped configuration to include a vertical part 25 and a horizontal part 26, where the vertical part may be disposed at one end of the horizontal part 26.

Figure 4:
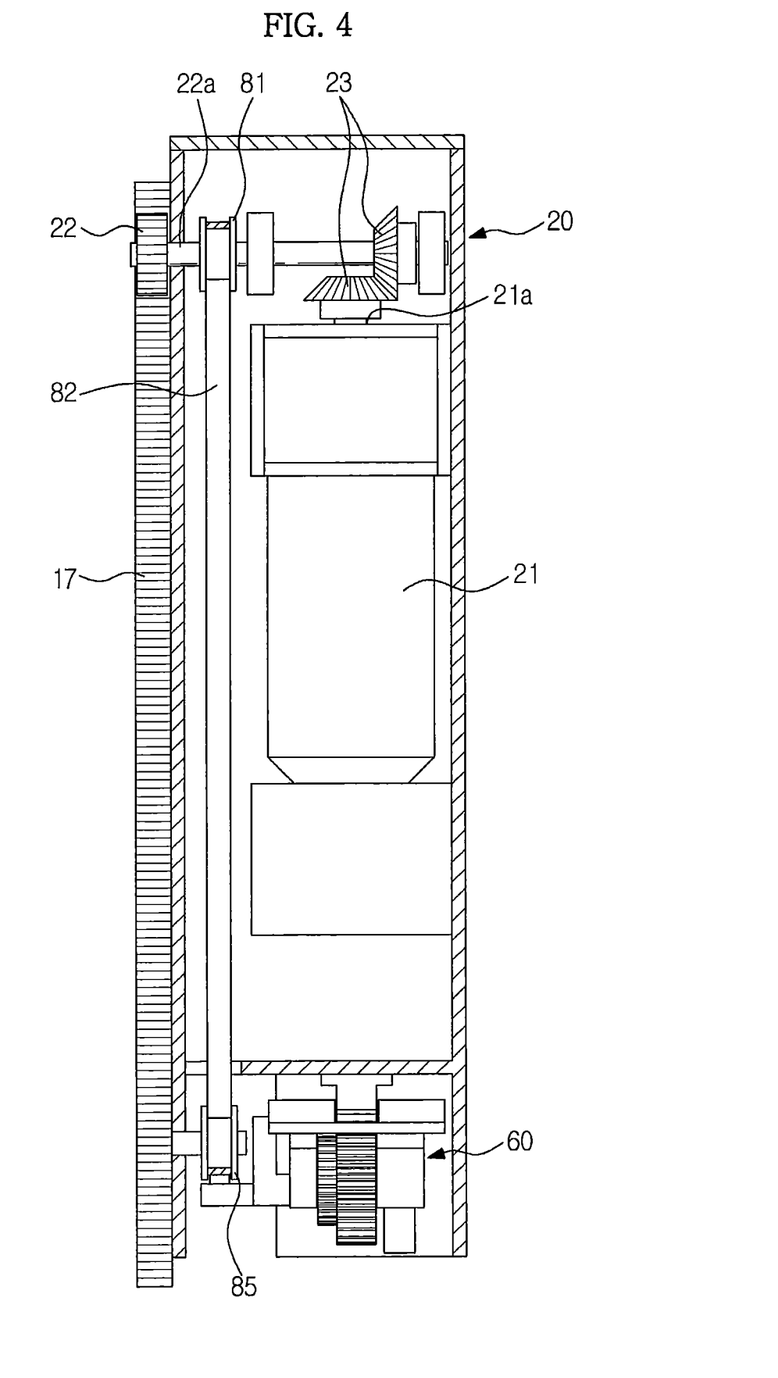
FIG. 4 is a front view of the carriage illustrating a drawer drive motor and a power transmission structure.
Figure 5:
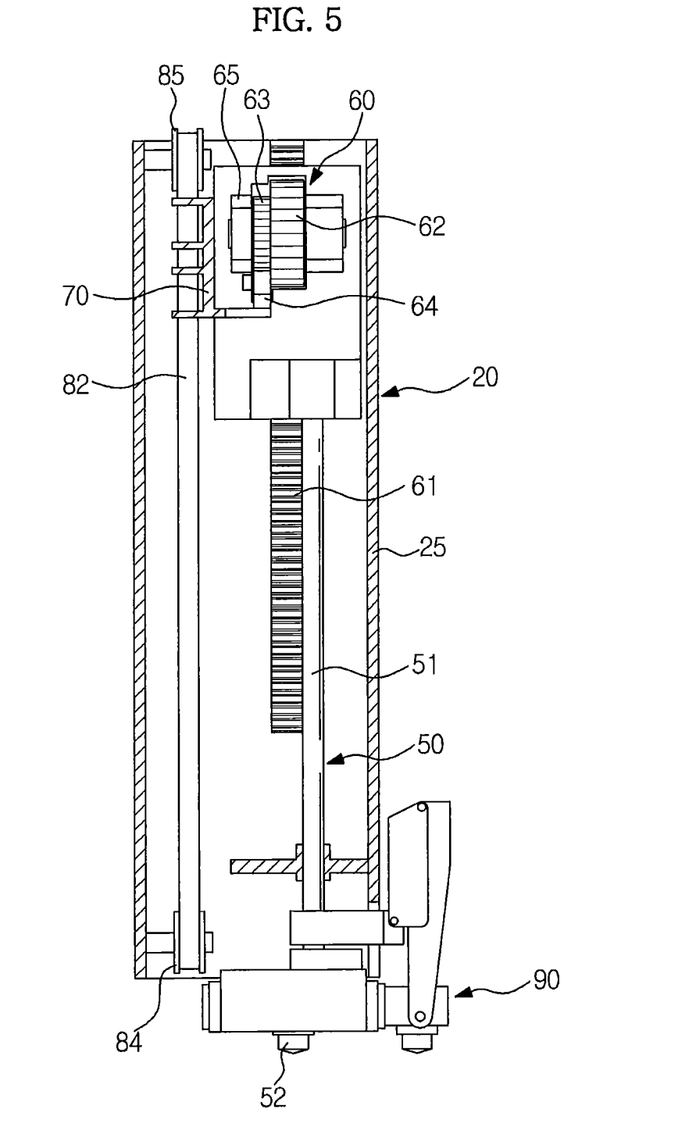
FIG. 5 is an enlarged view illustrating a state before extension of a support device and a fall prevention unit.

Further, with reference to FIGS. 4 and 5, in order to drive linear motion of the drawer unit 20, a drawer drive motor 21 is installed in the drawer unit 20. A pinion 22 driven by the drawer drive motor 21 is installed at one side of the drawer unit 20, and a rack 27 disposed in parallel with the forward and backward moving direction of the drawer unit 20 is installed at a region adjacent to the side of the drawer unit 20. The rack 17 and the pinion 22 are disposed to be engaged with each other, and when the pinion 22 is rotated, the pinion 22 and the drawer unit 20 supporting the pinion 22 linearly move along the rack 17 installed on the main body 10 with respect to the main body 10.

Structurally, the drawer drive motor 21 may be arranged in the lengthwise direction of the drawer unit 20. In this case, a drive shaft 21a of the drawer drive motor 21 and a rotary shaft 22a of the pinion 22 are disposed to be perpendicular to each other, and thus bevel gears 23 to transmit power may be installed between the drive shaft 21a of the drawer drive motor 21 and the rotary shaft 22a of the pinion 22.

With reference to FIGS. 1 to 5, the transfer robot 30 to transfer the probe card P and a manipulation unit 40 allowing a worker to manipulate operation of the carriage 10 are installed at one end of the drawer unit 20 distant from the main body 10.

The transfer robot 30 includes a vertical transfer unit 31 provided to be movable upward and downward from the drawer unit 20 in the vertical direction, a robot arm 32 installed at the upper end of the vertical transfer unit 31 in the horizontal direction, a rotation unit 33 to support the robot arm 32 such that the robot arm 32 is rotatable in the horizontal direction about the vertical transfer unit 31, and the holding unit 100 installed at the end of the robot arm 32 to hold the probe card P. A portion of the transfer robot 30 may be disposed on a side of the vertical part 25 of the drawer unit 20.

Figure 3:
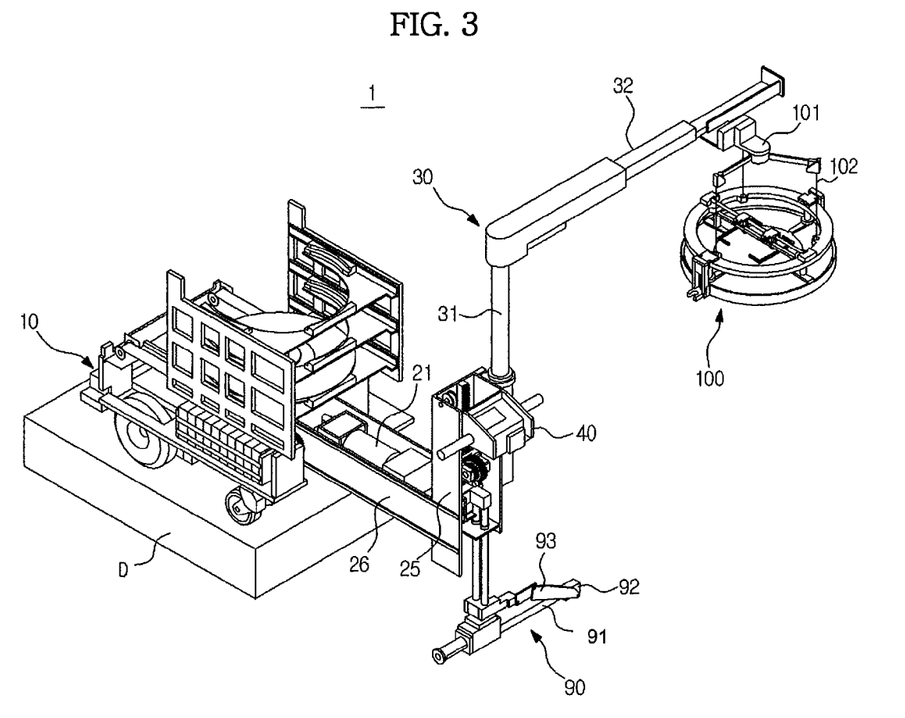
FIG. 3 is a perspective view illustrating a state in which a robot arm is unfolded.

The robot arm 32 may be a telescopic arm having a multi-stage structure to be expandable and contractible, and includes a clutch providing frictional force with respect to expansion and contraction of the robot arm 32. Therefore, due to predetermined frictional force of the clutch, a worker may move the holding unit 100 to a desired position without feeling inertia when the worker moves the holding unit 100 in the horizontal direction through the robot arm 32.

A weight sensing unit 101 to sense the weight of the probe card P is provided on the holding unit 100, and impedance control is applied to the vertical transfer unit 31 so that manipulation force required when the worker moves the probe card P upward and downward is adjusted according to the weight of the probe card P sensed by the weight sensing unit 101. Therefore, the worker may move the holding unit 100 through the manipulation unit 40 without directly feeling the weight of the probe card P when the holding unit 100 is vertically moved through the vertical transfer unit 31 under the condition that the probe card P is loaded on the holding unit 100.

Figure 1:
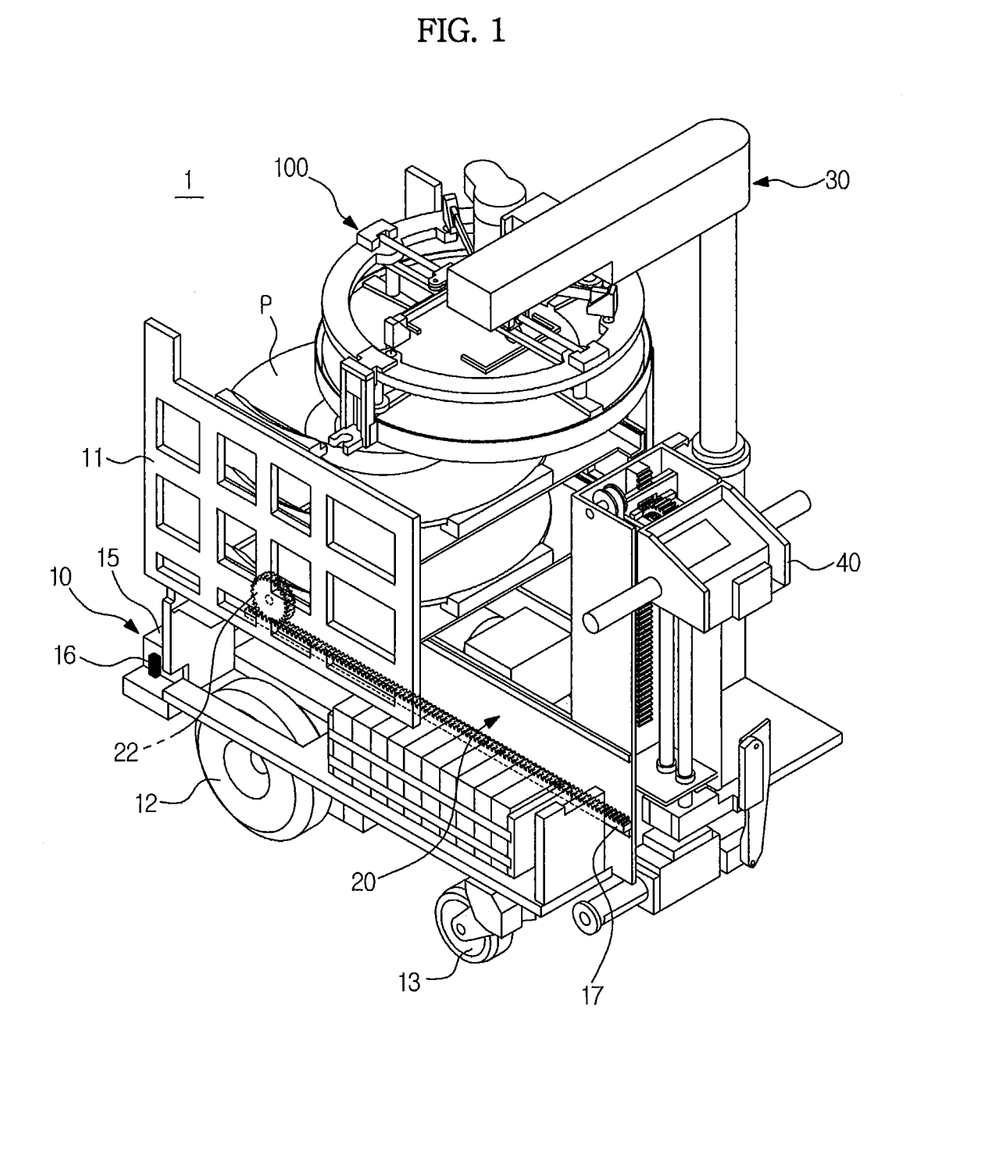
FIG. 1 is a perspective view of a probe card handling carriage in accordance with one embodiment of the present invention.
Figure 2:
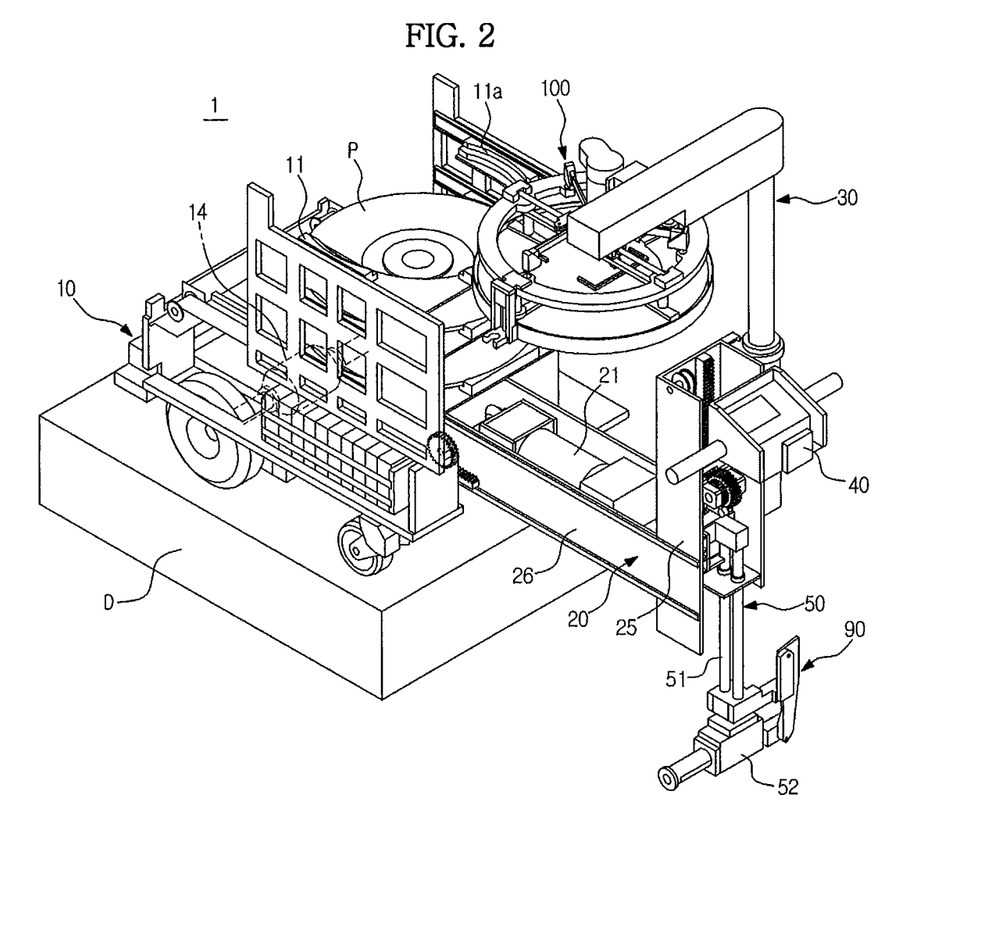
FIG. 2 is a perspective view illustrating a state in which a drawer unit of the carriage is extended.
Figure 6:
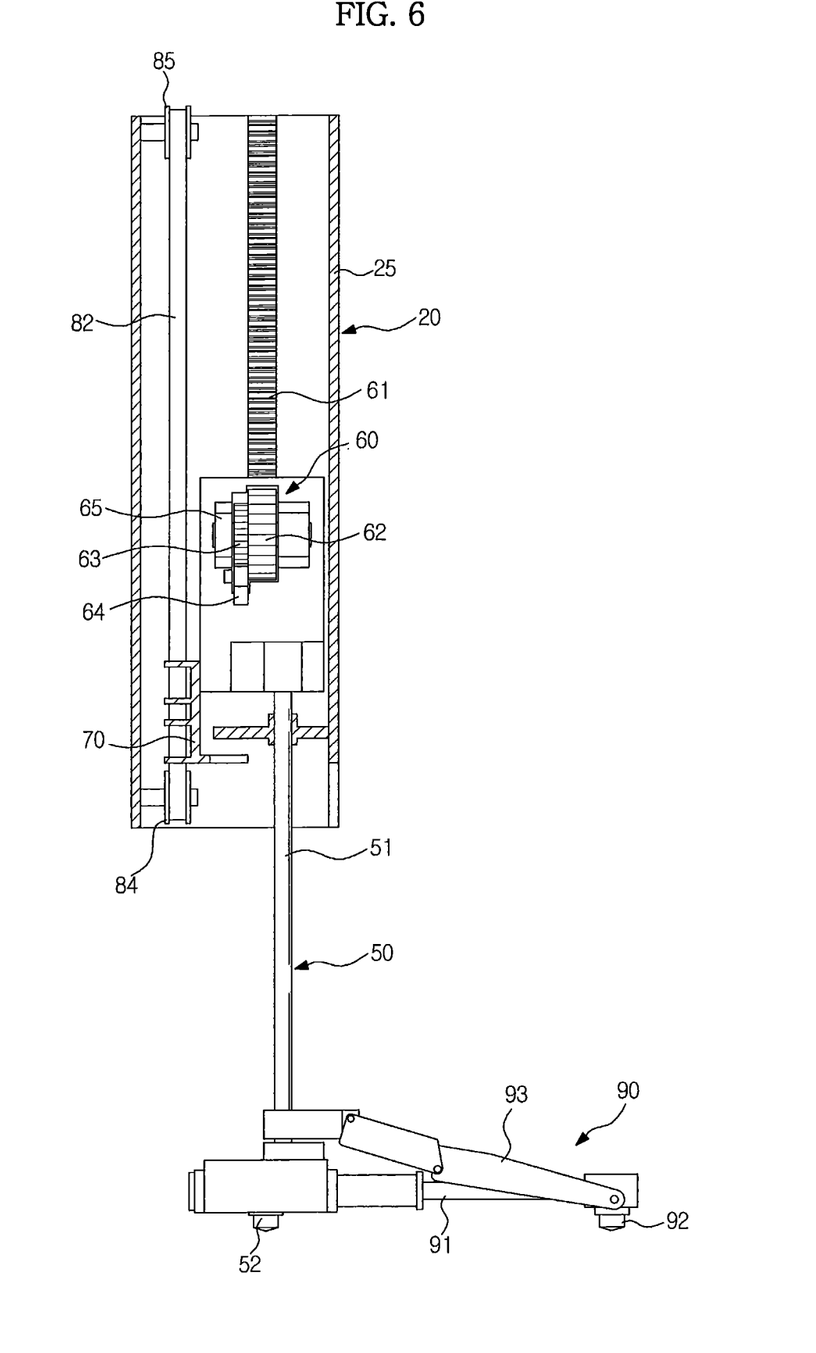
FIG. 6 is an enlarged view illustrating a state after extension of the support device and the fall prevention unit.

For example, as shown in FIGS. 2, 5 and 6, support device 50 provided to be supportable by the ground is installed on the drawer unit 20 in order to prevent the main body 10 from falling over, and includes a rod unit 51 connected to the drawer unit 20 to be movable forward and backward in the vertical direction and a support wheel 52 contacting the ground.

Further, a fall prevention unit 90 provided to be extendible in the horizontal direction and having supporting force with respect to the ground in the extending state is installed at the lower portion of the support device 50.

As shown in FIGS. 5 and 6, the fall prevention unit 90 includes a rod unit 91 provided to be movable forward and backward in the horizontal direction, a supporter 92 contacting the ground, and a link 93 installed between the support device 50 and the supporter 92 to reinforce the strength of the fall prevention unit 90.

The drawer unit 20 is provided on the main body 10 to be movable forward and backward in the horizontal direction, as described above. Therefore, although a distance from a moving path of the carriage 1 to a tester to test the probe card P is long, when the drawer unit 20 is extended, the robot arm 32 installed on the drawer unit 20 is moved together with the drawer unit 20, and thus the probe card P may be transferred to the tester without excessive approach of the carriage 1 to the tester and the maximum length of the robot arm 32 does not need to be increased. Accordingly, by use of the robot arm 32 together with the drawer unit 20 extended, a greater distance may be obtained between the tester and the main body 10 of the carriage 1, further improving safety.

However, as the position of the robot arm 320 becomes distant from the main body 10, moment applied to the main body 10 by the weights of the drawer unit 20, the robot arm 32 and the probe card P increases and a possibility that the main body 10 will fall over increases. Therefore, the support device 50 supported by the ground offsets such moment, thereby preventing the main body 10 from falling over in the extending direction of the drawer unit 20.

The support device 50 is connected to the drawer unit 20 to be movable upward and downward in the vertical direction, and a reverse prevention device 60 to enable downward movement of the support device 50 and to brake upward movement of the support device 50 when external force in the upward moving direction is applied to the support device 50 is installed between the drawer unit 20 and the support device 50. Therefore, if a duct D is provided on a working path on which the carriage 1 moves and the bottom surface of a place where equipment, such as the tester or a stocker, is located lower than the bottom surface of the working path (e.g., a stairwell or working path comprising stairs, for example), when the support device 50 is moved downward and the support wheel 52 contacts the ground while extending the drawer unit 20, downward movement of the support device 50 is stopped, and the stopped state of the support device 50 is maintained by the reverse prevention device 60 although moment in the upward moving direction of the support device 50 is applied. Thereby, the drawer unit 20 and the main body 10 may be supported by the ground through the support device 50, thus preventing the main body 10 from falling over.

Upward and downward movement of the support device 50 is linked with movement of the drawer unit 20. That is, as the drawer unit 20 is extended out of the main body 10, the support device 50 is moved downward, and as the drawer unit 20 is retracted into the main body 10, the support device 50 is moved upward. Further, the support device 50 is set such that the braking state by the reverse prevention device 60 is released when the support device 50 is moved upward.

The upward and downward movement of the support device 50 and release of the braking state of the reverse prevention device 60 are achieved by a carrier 70 and a drive device 80 to drive the carrier 70.

Figure 7:
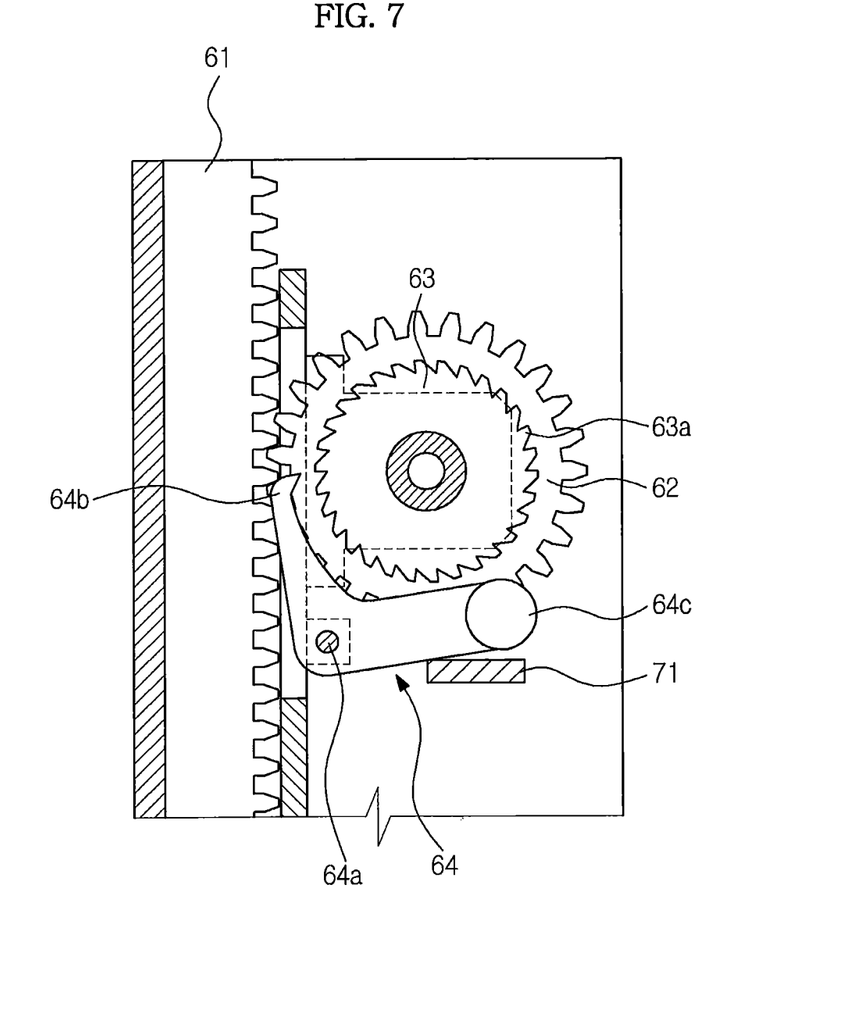
FIG. 7 is an enlarged view of a reverse prevention device illustrating a braking state by a pawl.
Figure 8:
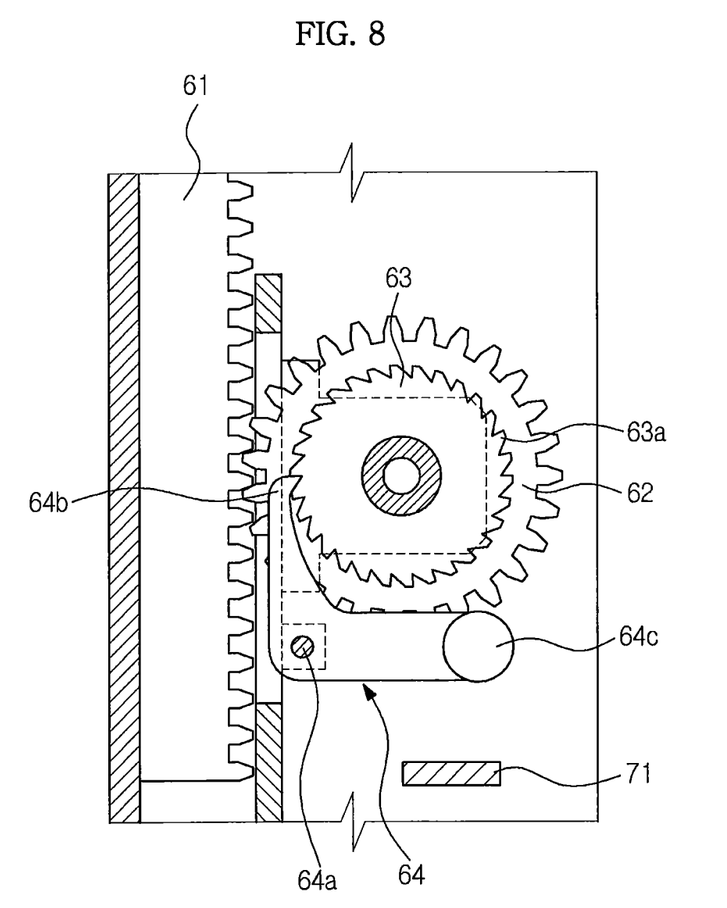
FIG. 8 is an enlarged view of the reverse prevention device illustrating a state in which braking by the pawl is released.

First, the reverse prevention device 60 includes a rack 61 arranged in a vertical part 25 of the drawer unit 20 in the vertical direction, a pinion 62 installed in the support device 50, engaged with the rack 61 and rotated according to upward and downward movement of the support device 50, a ratchet 63 operated in connection with the pinion 62, and a pawl 64 to restrict rotation of the ratchet 63 such that the ratchet 63 is rotated only in one direction.

The rack 61 may be arranged at a region where the support device 50 moves upward and downward along the vertical part 25 of the drawer unit 20, and the pinion 62 may be rotatably supported by a bearing 65.

As shown in FIGS. 7 and 8, the ratchet 63 is coaxially connected to the pinion 62 to be operated in connection with the pinion 62 and is provided with a plurality of screw threads 63a formed on the outer circumferential surface thereof, and the ratchet 63 and the pawl 64 are installed so as to enable rotation of the ratchet 63 in one direction according to the downward movement of the support device 50 and to exhibit braking force against rotation of the ratchet 63 in the opposite direction.

The pawl 64 is installed to be rotatable by a rotary shaft 64a, and includes a sawtooth 64b formed at one side of the pawl 64 and contacting the screw thread 63a of the ratchet 63 and a lever 64c formed at the side of the pawl 64 and contacting the carrier 70.

The carrier 70 is installed at one side of the rack 61 so as to be movable in parallel with the rack 61, is moved in the moving direction of the support device 50 by the drawer drive motor 21, and guides upward and downward movement of the support device 50. Such a carrier 70 is driven by the carrier drive device 80 driven by the drawer drive motor 21, and includes a pressing part 71 contacting the lever 64*c* of the pawl 64.

Figure 9:
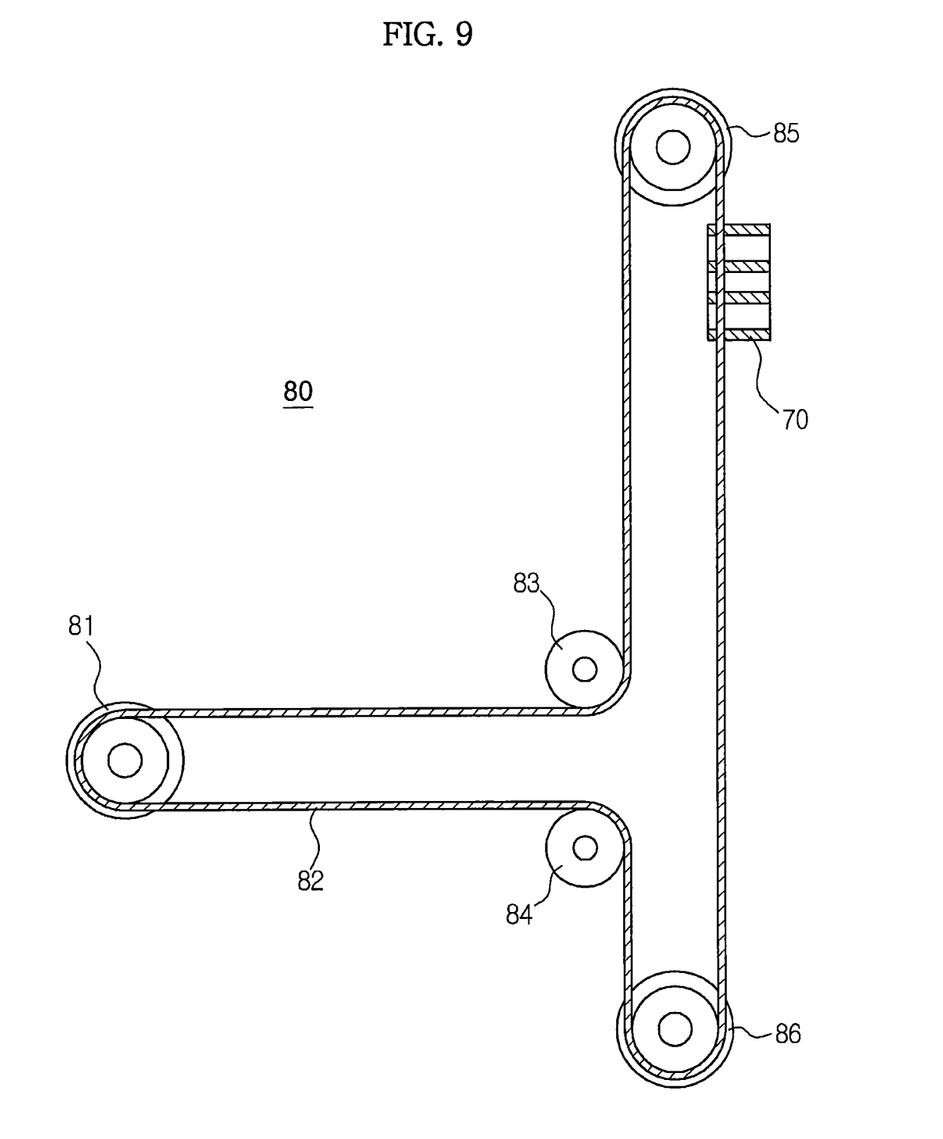
FIG. 9 is a structural view of a carrier drive device.

With reference to FIG. 9, the carrier drive device 80 includes a drive pulley 81 driven by the drawer drive motor 21, a belt 82 operated in connection with the drive pulley 81 and connected to the carrier 70 at one or more points, and plural guide pulleys 83, 84, 85 and 86 installed along a moving path of the belt 82.

The drive pulley 81 is arranged coaxially with the pinion 22 to drive the drawer unit 20, and the belt 82 is closed to pass through a horizontal part 26 and the vertical part 25 of the drawer unit 20 and then to return to the drive pulley 81. The carrier 70 is connected to the belt 82 and is moved upward and downward at the vertical, part 25 according to movement of the belt 82. Therefore, the carrier 70 is moved upward and downward according to forward and backward movement of the drawer unit 20, and the carrier 70 is located at the top dead center when the drawer unit 20 is completely retracted into the main body 10 throughout the overall stroke and is located at the bottom dead center when the drawer unit 20 is maximally extended.

Figure 10:
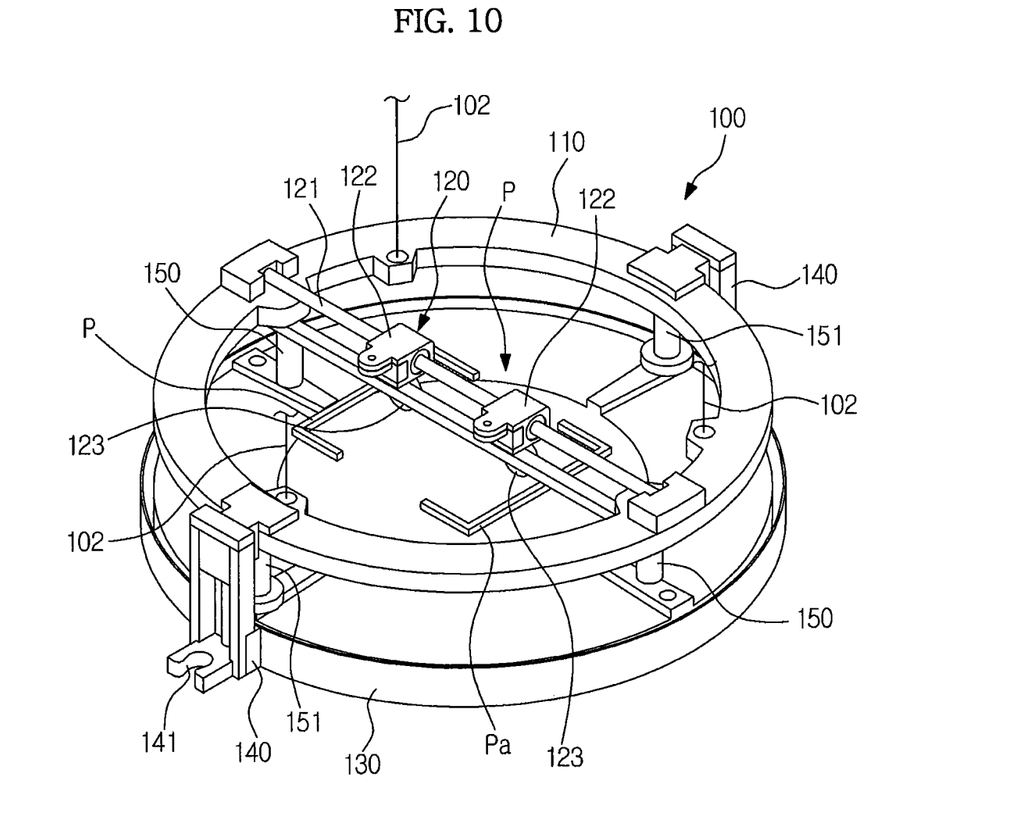
FIG. 10 is an enlarged view of a holding unit.
Figure 11:
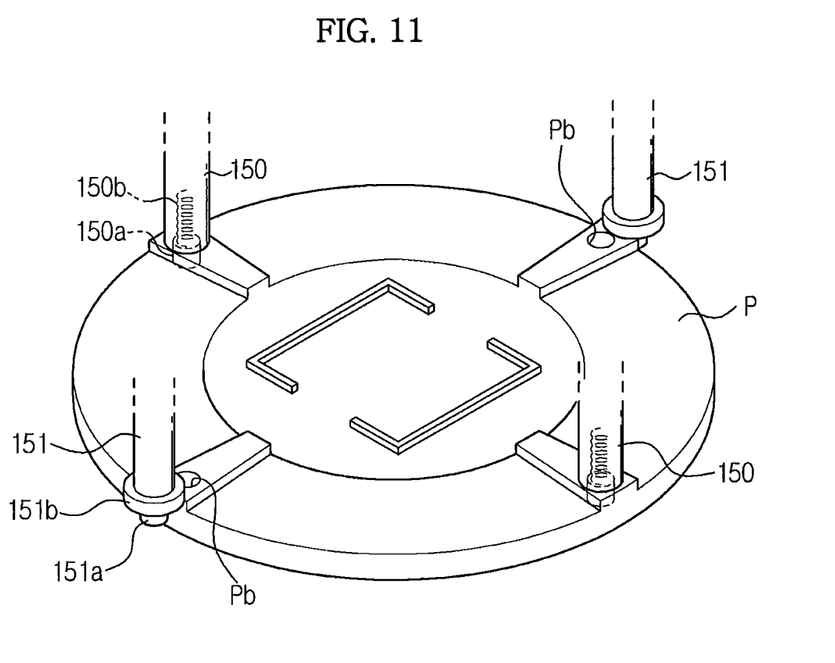
FIG. 11 is a schematic view illustrating a connection state between guide pins and a 440 mm probe card in a holding state of the 440 mm probe card by the holding unit.
Figure 12:
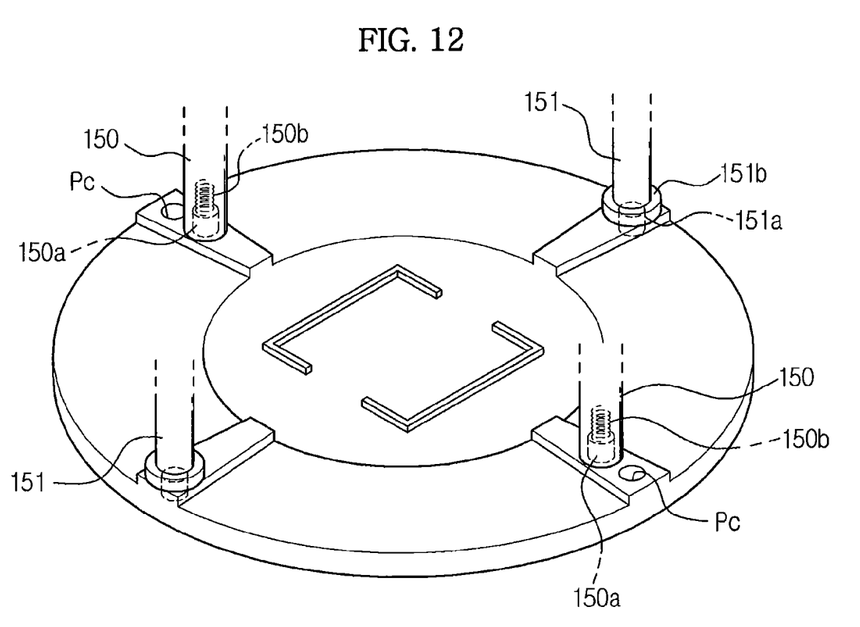
FIG. 12 is a schematic view illustrating a connection state between guide pins and a 480 mm probe card in a holding state of the 480 mm probe card by the holding unit.

With reference to FIGS. 10 to 12, the holding unit 100 includes a ring-shaped frame 110, a hook module 120 installed on the frame 110, a protective ring 130 separated downward from the frame 110, and insertion guides 140 and guide pins 150 and 151 respectively provided at the outside and the inside of the frame 110 and the protective ring 130.

Three wires 102 are connected between the frame 110 and the above-described weight sensing unit 101 (with reference to FIG. 3), thus forming a 3-point support structure to maintain the horizontal state of the frame 110.

The insertion guide 140 is provided with guide holes 141 corresponding to both a tester (not shown) for a 440 mm probe card and a tester (not shown) for a 480 mm probe card, and when the guide holes 141 are fitted to a probe card tester and then the frame 110 is moved downward, the probe card P is automatically guided so as to coincide with reference pins within the tester. Reference to the above-mentioned dimensions refers to a relative diameter size of the probe cards. Here, it should be noted that the dimensions of the probe card are merely provided as an example, and that one of ordinary skill in the art would appreciate variations to the holding unit may be made such that probe cards having other dimensions and/or shapes (e.g., rectangular, hexagonal, etc.) may be accommodated by appropriate modification of the holding unit.

The hook module 120 includes a rack 121 disposed across the inside of the frame 110, a pair of pinions 122 connected to the rack 121 and linearly moving on the rack 121, and a pair of hooks 123 connected to the lower portions of the pinions 122.

The hooks 123 may be formed in a nippers-shaped structure which is extendible to hold hand grips Pa of the probe card R Therefore, when a worker locates the pinions 122 under the hand grips Pa, extends the hooks 123 such that the hand grips Pa are located at the inside of the hooks 123, and then removes force applied to the hooks 123, the hand grips Pa may be held by the hooks 123. When the pinions 122 are moved to the edge of the probe card P under the condition the hand grips Pa are held by the hooks 123, the probe card P is raised.

The guide pins 150 and 151 contact the probe card P and support the probe card P under the condition that the probe card P is raised by movement of the pinions 122 after holding of the probe card P through the hooks 123. The guide pins 150 and 151 include first guide pins 150 corresponding to a probe card of a standard of 440 mm and second guide pins 151 corresponding to a probe card of a standard of 480 mm.

The first guide pins 150 and the second guide pins 151 are respectively provided in a pair, and the pair of first guide pins 150 and the pair of second guide pins 151 are opposite to each other on the frame 110. While the holding unit 100 has been disclosed in one example as including first guide pins 150 and second guide pins, the disclosure is not so limited. For example, the holding unit 100 may include additional guide pins to further support the probe card P.

Insertion parts 150*a* and 151*a* connected to holes Pb and Pc provided on probe cards P are provided on the lower portions of the guide pins 150 and 151. The insertion parts 150*a* of the first guide pins 150 are disposed on the frame 111 at positions corresponding to holes Pb of a probe card of a standard of 440 mm, and the insertion parts 151*a* of the second guide pins 151 are disposed on the frame 111 at relatively outer positions than the insertion parts 150*a* of the first guide pins 50 corresponding to holes Pc of a probe card of a standard of 480 mm.

The insertion part 150*a* of the first guide pin 150 is installed such that the first guide pin 150 is movable forward and backward in the lengthwise direction, and is elastically supported by an elastic member 150*b* installed within the first guide pin 150. The elastic spring may be a spring (e.g., a coil spring or helical spring), may be rubber, a gum, a sponge, or the like, for example.

While the holding unit 100 has been disclosed in one example as including first guide pins 150 which are movable in a forward and backward direction, the disclosure is not so limited. For example, second guide pins 151 may not include a flange part 151*b*, and therefore both first guide pins 150 and second guide pins 151 may be movable in a forward and backward direction. Alternatively, one of ordinary skill in the art may modify holding unit 100 such that both first guide pins 150 and second guide pins 151 may include a flange part and are not moveable.

Further, a flange part 151*b* having a larger diameter than the insertion part 151*a* and extending in the circumferential direction of the second guide pin 151 is formed above the insertion part 151*a* of the second guide pin 151.

Therefore, when the holding unit 100 (with reference to FIG. 10) holds a probe card of a standard of 440 mm, as shown in FIG. 11, the insertion parts 150*a* of the first guide pins 150 are inserted into the holes Pb but the insertion parts 151*a* of the second guide pins 151 are not inserted into the holes Pb and are located at the outside of the probe card P, and instead, the flange parts 151*b* becomes in area contact with the upper surface of the edge of the probe card P and thus support the probe card P.

On the other hand, when the holding unit 100 (with reference to FIG. 10) holds a probe card of a standard of 480 mm, as shown in FIG. 12, the insertion parts 151*a* of the second guide pins 151 are inserted into the holes Pc but the insertion parts 150*a* of the first guide pins 150 are not inserted into the holes Pc and are pressed and inserted into the first guide pins 150 to maintain a contact state with the probe card P.

Hereinafter, an operating process of the above-described carriage 1 will be described based on a process of transferring a probe card P to a tester.

First, a worker travels the carriage 1 to be located close to the tester (not shown). In this state, the drawer unit 20 is retracted into the main body 10, and the carrier 70 is located at the upper portion of the vertical part 25 while supporting the support device 50. Thereafter, when the rotary shaft 21*a* of the drawer drive motor 21 is rotated in the extending direction of the drawer unit 20, the drawer unit 20 is extended and simultaneously, the drive pulley 81 is rotated to move the belt 82 and the carrier 70 and the support device 50 are moved downward together according to movement of the belt 82. When the support wheel 52 contacts the ground during downward movement of the support device 50, downward movement of the support device 50 is stopped, but the carrier 70 is moved downward to a point where the drawer unit 20 is extended by the drawer drive motor 21 regardless of the movement of the support device 50 and is then stopped together with stoppage of operation of the drawer drive motor 21. In this state, the support device 50 exhibits supporting force against the ground while maintaining the braking state in the upward moving direction by the reverse prevention device 60. Here, in order to offset moment due to extension of the robot arm 32, the fall prevention unit 90 is extended before extension of the robot arm 32. When extension of the drawer unit 20, the support device 50 and the fall prevention unit 90 have been completed, the probe card P from the slot 11a is held by the holding unit 100, and rotation of the holding unit 100, extension of the robot arm 32, downward movement of the holding unit 100, and loading of the probe card P on the tester are sequentially executed.

Thereafter, when transfer of the probe card P to the tester has been completed, such operations are executed in reverse order. When the drawer drive motor 21 is operated and the drawer unit 20 starts to be retracted into the main body 10, the carrier 70 is raised again and approaches the pawl 64, and then when the pressing part 71 of the carrier 70 contacts the lever 64c of the pawl 64, the pressing part 71 presses the lever 64c upward, the sawtooth 64b of the pawl 64 is moved to release the contact state with the screw thread 63a, and the braking state of the ratchet 63 by the pawl 64 is released. Therefore, the support device 50 is raised together with the carrier 70 and is operated in connection with the carrier 70, which is operated in connection with movement of the drawer unit 20, and the upward movement of the support device 50 is stopped simultaneously with stoppage of retraction of the drawer unit 20 into the main body 10.

According to the above described embodiments, a probe card handling carriage has been disclosed which is capable of safely transferring probe cards of various standards and dimensions. Additionally, the probe card carriage is provided with a drawer unit which is moveable in a horizontal direction, the drawer unit being linked to other devices within the main body of the probe card handling carriage, such that movement of the drawer unit causes simultaneous movement of a support device, for example, which prevents the main body from falling due to gravitational and moment forces acting on the main body. The support device further provides the capability to extend the drawer unit outward in circumstances involving an unlevel or uneven surface. For example, a surface below the extended drawer unit may be lower than a surface upon which the main body is disposed. The support device may be lowered until the support device contacts the lower surface to provide support to the main body and the extended drawer unit.

Although a few embodiments of the present invention have been shown and described, it would be appreciated by those skilled in the art that changes may be made to these embodiments without departing from the principles and spirit of the invention, the scope of which is defined in the claims and their equivalents.

What is claimed is:

1. A probe card handling carriage comprising:
   a main body travelable on a surface;
   a drawer unit movable in a forward and backward direction with respect to the main body;
   a transfer robot installed on the drawer unit to transfer a probe card; and
   a support device installed on the drawer unit and supportable by the surface,
   wherein the support device moves downward or upward.

2. The probe card handling carriage according to claim 1, wherein the support device is moved downward in response to extension of the drawer unit out of the main body.

3. The probe card handling carriage according to claim 2, further comprising a reverse prevention device to enable downward movement of the support device and to maintain a braking state by preventing upward movement of the support device.

4. The probe card handling carriage according to claim 3, wherein the reverse prevention device releases the braking state in response to retraction of the drawer unit into the main body.

5. A probe card handling carriage comprising:
   a main body travelable on a surface;
   a drawer unit movable in a forward and backward direction with respect to the main body;
   a transfer robot installed on the drawer unit to transfer a probe card;
   a support device installed on the drawer unit and supportable by the surface; and
   a reverse prevention device to enable downward movement of the support device and to maintain a braking state by preventing upward movement of the support device,
   wherein the reverse prevention device includes a rack arranged in the vertical direction on the drawer unit, a pinion installed on the support device, engaged with the rack and rotated according to upward and downward movement of the support device, a ratchet operated in connection with the pinion, and a pawl to restrict rotation of the ratchet to one direction.

6. The probe card handling carriage according to claim 5, further comprising:
   a drawer drive motor to drive forward and backward movement of the drawer unit; and
   a carrier moved by the drawer drive motor to guide upward and downward movement of the support device.

7. The probe card handling carriage according to claim 6, wherein a portion of the carrier contacts the pawl and rotates the pawl to release restriction of rotation of the ratchet by the pawl.

8. The probe card handling carriage according to claim 6, further comprising:
   a drive pulley driven by the drawer drive motor to drive the carrier; and
   a belt operated in connection with the drive pulley and connected to the carrier.

9. The probe card handling carriage according to claim 1, wherein the transfer robot includes a holding unit configured to hold probe cards having different dimensions.

10. The probe card handling carriage according to claim 9, wherein the holding unit includes a plurality of guide pins to contact the probe card when the probe card is held by the holding unit, and each of the plurality of guide pins includes an insertion part to connect to a corresponding hole provided on the probe card to support the probe card.

11. The probe card handling carriage according to claim 10, wherein the plurality of guide pins includes at least one first guide pin and at least one second guide pin, and the at least one second guide pin is disposed at an outer region in the circumferential direction of the probe card relative to the at least one first guide pin.

12. The probe card handling carriage according to claim 11, wherein the insertion part of the at least one first guide pin is movable forward and backward in a lengthwise direction of the at least one guide pin and is elastically supported by an elastic member.

13. The probe card handling carriage according to claim 11, wherein the at least one second guide pin includes a flange part formed above the insertion part of the at least one second guide pin, and extends in a circumferential direction of the at least one second guide pin.

14. A probe card handling carriage comprising:
a main body;
a drawer unit slidably installed in the main body and moveable in a horizontal direction;
a support device connected to an end of the drawer unit and moveable in a vertical direction to support the main body;
a transfer robot connected to the drawer unit, moveable in a vertical direction and including an arm rotatable in a circumferential direction to transfer a probe card,
wherein movement of the support device in the vertical direction is linked with movement of the drawer unit in the horizontal direction.

15. The probe card handling carriage according to claim 14, wherein the drawer unit includes a vertical part and a horizontal part, the vertical part of the drawer unit including a carrier moveable in a vertical direction according to movement of the drawer unit in the horizontal direction,
wherein the carrier moves the support device via one or more pulleys.

16. The probe card handling carriage according to claim 15, wherein movement of the drawer unit in an outward horizontal direction causes simultaneous movement of the carrier and support device in a downward vertical direction.

17. The probe card handling carriage according to claim 16, wherein if the support device contacts a surface during downward movement of the support device, movement of the support device stops and the carrier continues downward movement.

18. The probe card handling carriage according to claim 14, wherein the support device includes:
a rod unit extendable in the vertical direction;
a support wheel disposed on a bottom portion of the support device to contact the ground;
a fall prevention unit extendible in a horizontal direction installed at a lower portion of the support device to support the main body.

19. The probe card handling carriage according to claim 1, wherein the transfer robot moves together with the drawer unit such that as the drawer unit is extended out of the main body, the transfer robot simultaneously moves away from the main body.

20. The probe card handling carriage according to claim 1, wherein the support device includes:
a rod unit extendable in the vertical direction;
a support wheel disposed on a bottom portion of the support device to contact the surface;
a fall prevention unit extendible in a horizontal direction installed at a lower portion of the support device to support the main body.

* * * * *